(12) United States Patent
Levesque et al.

(10) Patent No.: US 9,325,281 B2
(45) Date of Patent: Apr. 26, 2016

(54) POWER AMPLIFIER CONTROLLER

(71) Applicant: RF Micro Devices, Inc., Greensboro, NC (US)

(72) Inventors: Chris Levesque, Fountain Valley, CA (US); Kevin Wesley Kobayashi, Redondo Beach, CA (US); Praveen Varma Nadimpalli, Chandler, AZ (US); Ricke W. Clark, Irvine, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 14/067,019

(22) Filed: Oct. 30, 2013

(65) Prior Publication Data

US 2014/0118074 A1    May 1, 2014

Related U.S. Application Data

(60) Provisional application No. 61/720,149, filed on Oct. 30, 2012.

(51) Int. Cl.
*H03F 3/21*     (2006.01)
*H03F 1/52*     (2006.01)
(Continued)

(52) U.S. Cl.
CPC .................. *H03F 3/21* (2013.01); *H03F 1/305* (2013.01); *H03F 1/523* (2013.01); *H03F 3/193* (2013.01);
(Continued)

(58) Field of Classification Search
CPC ............. H03F 3/16; H03F 3/19; H03F 3/193; H03F 1/02; H03F 1/0261; H03F 1/223; H03F 1/301; H03F 1/3205; H03F 1/52; H03F 1/523; H03F 2200/18; H03F 2200/27; H03F 2200/451; H03F 2200/471

USPC .......................... 330/51, 285, 296, 302, 289
See application file for complete search history.

(56) References Cited

U.S. PATENT DOCUMENTS 4,317,055 A    2/1982   Yoshida et al.
4,540,954 A    9/1985   Apel
(Continued)

FOREIGN PATENT DOCUMENTS

EP    1187229 A1    3/2002
EP    1826041 A1    8/2007
(Continued)

OTHER PUBLICATIONS

Boutros, K.S., et al., "5W GaN MMIC for Millimeter-Wave Applications," 2006 Compound Semiconductor Integrated Circuit Symposium, Nov. 2006, pp. 93-95.
(Continued)

*Primary Examiner* — Khanh V Nguyen
(74) *Attorney, Agent, or Firm* — Withrow & Terranova, P.L.L.C.

(57) ABSTRACT

The present disclosure provides a power amplifier controller for starting up, operating, and shutting down a power amplifier. The power amplifier controller includes current sense amplifier circuitry adapted to monitor a main current of the power amplifier. A bias generator is also included and adapted to provide a predetermined standby bias voltage and an operational bias voltage based upon a main current level sensed by the current sense amplifier circuitry. The power amplifier controller further includes a sequencer adapted to control startup and shutdown sequences of the power amplifier. In at least one embodiment, the power amplifier is a gallium nitride (GaN) device, and the main current level sensed is a drain current of the GaN device. Moreover, the bias generator is a gate bias generator provided that the power amplifier is a field effect transistor (FET) device.

21 Claims, 13 Drawing Sheets

(51) Int. Cl.
  *H03F 1/30* (2006.01)
  *H03F 3/193* (2006.01)
  *H03G 3/30* (2006.01)
  *H03F 3/72* (2006.01)

(52) U.S. Cl.
  CPC ............ *H03G 3/3042* (2013.01); *H03F 3/72*
  (2013.01); *H03F 2200/18* (2013.01); *H03F*
  *2200/468* (2013.01); *H03F 2203/45284*
  (2013.01)

(56) References Cited

U.S. PATENT DOCUMENTS

| | | |
|---|---|---|
| 4,543,535 A | 9/1985 | Ayasli |
| 4,620,207 A | 10/1986 | Calviello |
| 4,788,511 A | 11/1988 | Schindler |
| 5,028,879 A | 7/1991 | Kim |
| 5,046,155 A | 9/1991 | Beyer et al. |
| 5,047,355 A | 9/1991 | Huber et al. |
| 5,107,323 A | 4/1992 | Knolle et al. |
| 5,118,993 A | 6/1992 | Yang |
| 5,208,547 A | 5/1993 | Schindler |
| 5,227,734 A | 7/1993 | Schindler et al. |
| 5,306,656 A | 4/1994 | Williams et al. |
| 5,361,038 A | 11/1994 | Allen et al. |
| 5,365,197 A | 11/1994 | Ikalainen |
| 5,389,571 A | 2/1995 | Takeuchi et al. |
| 5,414,387 A | 5/1995 | Nakahara et al. |
| 5,485,118 A | 1/1996 | Chick |
| 5,608,353 A | 3/1997 | Pratt |
| 5,629,648 A | 5/1997 | Pratt |
| 5,698,870 A | 12/1997 | Nakano et al. |
| 5,742,205 A | 4/1998 | Cowen et al. |
| 5,764,673 A | 6/1998 | Kawazu et al. |
| 5,834,326 A | 11/1998 | Miyachi et al. |
| 5,843,590 A | 12/1998 | Miura et al. |
| 5,864,156 A | 1/1999 | Juengling |
| 5,874,747 A | 2/1999 | Redwing et al. |
| 5,880,640 A | 3/1999 | Dueme |
| 5,914,501 A | 6/1999 | Antle et al. |
| 5,949,140 A | 9/1999 | Nishi et al. |
| 6,049,250 A | 4/2000 | Kintis et al. |
| 6,064,082 A | 5/2000 | Kawai et al. |
| 6,110,757 A | 8/2000 | Udagawa et al. |
| 6,130,579 A | 10/2000 | Iyer et al. |
| 6,133,589 A | 10/2000 | Krames et al. |
| 6,177,685 B1 | 1/2001 | Teraguchi et al. |
| 6,191,656 B1 | 2/2001 | Nadler |
| 6,229,395 B1 | 5/2001 | Kay |
| 6,265,943 B1 | 7/2001 | Dening et al. |
| 6,271,727 B1 | 8/2001 | Schmukler |
| 6,285,239 B1 | 9/2001 | Iyer et al. |
| 6,306,709 B1 | 10/2001 | Miyagi et al. |
| 6,307,364 B1 | 10/2001 | Augustine |
| 6,313,705 B1 | 11/2001 | Dening et al. |
| 6,329,809 B1 | 12/2001 | Dening et al. |
| 6,333,677 B1 | 12/2001 | Dening |
| 6,342,815 B1 | 1/2002 | Kobayashi |
| 6,356,150 B1 | 3/2002 | Spears et al. |
| 6,369,656 B2 | 4/2002 | Dening et al. |
| 6,369,657 B2 | 4/2002 | Dening et al. |
| 6,373,318 B1 | 4/2002 | Dohnke et al. |
| 6,376,864 B1 | 4/2002 | Wang |
| 6,377,125 B1 | 4/2002 | Pavio et al. |
| 6,384,433 B1 | 5/2002 | Barratt et al. |
| 6,387,733 B1 | 5/2002 | Holyoak et al. |
| 6,392,487 B1 | 5/2002 | Alexanian |
| 6,400,226 B2 | 6/2002 | Sato |
| 6,404,287 B2 | 6/2002 | Dening et al. |
| 6,448,793 B1 | 9/2002 | Barratt et al. |
| 6,455,877 B1 | 9/2002 | Ogawa et al. |
| 6,475,916 B1 | 11/2002 | Lee et al. |
| 6,477,682 B2 | 11/2002 | Cypher |
| 6,521,998 B1 | 2/2003 | Teraguchi et al. |
| 6,525,611 B1 | 2/2003 | Dening et al. |
| 6,528,983 B1 | 3/2003 | Augustine |
| 6,560,452 B1 | 5/2003 | Shealy |
| 6,566,963 B1 | 5/2003 | Yan et al. |
| 6,589,877 B1 | 7/2003 | Thakur |
| 6,593,597 B2 | 7/2003 | Sheu |
| 6,608,367 B1 | 8/2003 | Gibson et al. |
| 6,614,281 B1 | 9/2003 | Baudelot et al. |
| 6,621,140 B1 | 9/2003 | Gibson et al. |
| 6,624,452 B2 | 9/2003 | Yu et al. |
| 6,627,552 B1 | 9/2003 | Nishio et al. |
| 6,633,073 B2 | 10/2003 | Rezvani et al. |
| 6,633,195 B2 | 10/2003 | Baudelot et al. |
| 6,639,470 B1 * | 10/2003 | Andrys et al. ............ 330/296 |
| 6,656,271 B2 | 12/2003 | Yonehara et al. |
| 6,657,592 B2 | 12/2003 | Dening et al. |
| 6,660,606 B2 | 12/2003 | Miyabayashi et al. |
| 6,701,134 B1 | 3/2004 | Epperson |
| 6,701,138 B2 | 3/2004 | Epperson et al. |
| 6,706,576 B1 | 3/2004 | Ngo et al. |
| 6,720,831 B2 | 4/2004 | Dening et al. |
| 6,723,587 B2 | 4/2004 | Cho et al. |
| 6,724,252 B2 | 4/2004 | Ngo et al. |
| 6,727,762 B1 | 4/2004 | Kobayashi |
| 6,748,204 B1 | 6/2004 | Razavi et al. |
| 6,750,158 B2 | 6/2004 | Ogawa et al. |
| 6,750,482 B2 | 6/2004 | Seaford et al. |
| 6,759,907 B2 | 7/2004 | Orr et al. |
| 6,802,902 B2 | 10/2004 | Beaumont et al. |
| 6,815,722 B2 | 11/2004 | Lai et al. |
| 6,815,730 B2 | 11/2004 | Yamada |
| 6,822,842 B2 | 11/2004 | Friedrichs et al. |
| 6,861,677 B2 | 3/2005 | Chen |
| 6,943,631 B2 | 9/2005 | Scherrer et al. |
| 7,015,512 B2 | 3/2006 | Park et al. |
| 7,026,665 B1 | 4/2006 | Smart et al. |
| 7,033,961 B1 | 4/2006 | Smart et al. |
| 7,042,150 B2 | 5/2006 | Yasuda |
| 7,052,942 B1 | 5/2006 | Smart et al. |
| 7,211,822 B2 | 5/2007 | Nagahama et al. |
| 7,408,182 B1 | 8/2008 | Smart et al. |
| 7,449,762 B1 | 11/2008 | Singh |
| 7,459,356 B1 | 12/2008 | Smart et al. |
| 7,557,421 B1 | 7/2009 | Shealy et al. |
| 7,719,055 B1 | 5/2010 | McNutt et al. |
| 7,768,758 B2 | 8/2010 | Maier et al. |
| 7,804,262 B2 | 9/2010 | Schuster et al. |
| 7,935,983 B2 | 5/2011 | Saito et al. |
| 7,968,391 B1 | 6/2011 | Smart et al. |
| 7,974,322 B2 | 7/2011 | Ueda et al. |
| 8,017,981 B2 | 9/2011 | Sankin et al. |
| 8,405,068 B2 | 3/2013 | O'Keefe |
| 8,502,258 B2 | 8/2013 | O'Keefe |
| 8,633,518 B2 | 1/2014 | Suh et al. |
| 8,692,294 B2 | 4/2014 | Chu et al. |
| 8,785,976 B2 | 7/2014 | Nakajima et al. |
| 2001/0040246 A1 | 11/2001 | Ishii |
| 2001/0054848 A1 | 12/2001 | Baudelot et al. |
| 2002/0031851 A1 | 3/2002 | Linthicum et al. |
| 2002/0048302 A1 | 4/2002 | Kimura |
| 2002/0079508 A1 | 6/2002 | Yoshida |
| 2003/0003630 A1 | 1/2003 | Iimura et al. |
| 2003/0122139 A1 | 7/2003 | Meng et al. |
| 2003/0160307 A1 | 8/2003 | Gibson et al. |
| 2003/0160317 A1 | 8/2003 | Sakamoto et al. |
| 2003/0206440 A1 | 11/2003 | Wong |
| 2003/0209730 A1 | 11/2003 | Gibson et al. |
| 2003/0218183 A1 | 11/2003 | Micovic et al. |
| 2004/0070003 A1 | 4/2004 | Gaska et al. |
| 2004/0130037 A1 | 7/2004 | Mishra et al. |
| 2004/0241916 A1 | 12/2004 | Chau et al. |
| 2005/0139868 A1 | 6/2005 | Anda |
| 2005/0189559 A1 | 9/2005 | Saito et al. |
| 2005/0189562 A1 | 9/2005 | Kinzer et al. |
| 2005/0194612 A1 | 9/2005 | Beach |
| 2005/0212049 A1 | 9/2005 | Onodera |
| 2005/0225912 A1 | 10/2005 | Pant et al. |
| 2005/0271107 A1 | 12/2005 | Murakami et al. |
| 2006/0043385 A1 | 3/2006 | Wang et al. |
| 2006/0068601 A1 | 3/2006 | Lee et al. |

(56) References Cited

U.S. PATENT DOCUMENTS

| | | |
|---|---|---|
| 2006/0124960 A1 | 6/2006 | Hirose et al. |
| 2006/0205161 A1 | 9/2006 | Das et al. |
| 2006/0243988 A1 | 11/2006 | Narukawa et al. |
| 2007/0093009 A1 | 4/2007 | Baptist et al. |
| 2007/0295985 A1 | 12/2007 | Weeks, Jr. et al. |
| 2008/0023706 A1 | 1/2008 | Saito et al. |
| 2008/0073752 A1 | 3/2008 | Asai et al. |
| 2008/0112448 A1 | 5/2008 | Ueda et al. |
| 2008/0121875 A1 | 5/2008 | Kim |
| 2008/0142837 A1 | 6/2008 | Sato et al. |
| 2008/0179737 A1 | 7/2008 | Haga et al. |
| 2008/0190355 A1 | 8/2008 | Chen et al. |
| 2008/0272382 A1 | 11/2008 | Kim et al. |
| 2008/0272422 A1 | 11/2008 | Min |
| 2008/0283821 A1 | 11/2008 | Park et al. |
| 2008/0308813 A1 | 12/2008 | Suh et al. |
| 2009/0072269 A1 | 3/2009 | Suh et al. |
| 2009/0090984 A1 | 4/2009 | Khan et al. |
| 2009/0146185 A1 | 6/2009 | Suh et al. |
| 2009/0146186 A1 | 6/2009 | Kub et al. |
| 2009/0166677 A1 | 7/2009 | Shibata et al. |
| 2009/0273002 A1 | 11/2009 | Chiou et al. |
| 2009/0278137 A1 | 11/2009 | Sheridan et al. |
| 2010/0025657 A1 | 2/2010 | Nagahama et al. |
| 2010/0133567 A1 | 6/2010 | Son |
| 2010/0187575 A1 | 7/2010 | Baumgartner et al. |
| 2010/0207164 A1 | 8/2010 | Shibata et al. |
| 2010/0230656 A1 | 9/2010 | O'Keefe |
| 2010/0230717 A1 | 9/2010 | Saito |
| 2010/0258898 A1 | 10/2010 | Lahreche |
| 2011/0017972 A1 | 1/2011 | O'Keefe |
| 2011/0025422 A1* | 2/2011 | Marra et al. ............... 330/296 |
| 2011/0031633 A1 | 2/2011 | Hsu et al. |
| 2011/0095337 A1 | 4/2011 | Sato |
| 2011/0101300 A1 | 5/2011 | O'Keefe |
| 2011/0115025 A1 | 5/2011 | Okamoto |
| 2011/0127586 A1 | 6/2011 | Bobde et al. |
| 2011/0163342 A1 | 7/2011 | Kim et al. |
| 2011/0175142 A1 | 7/2011 | Tsurumi et al. |
| 2011/0199148 A1 | 8/2011 | Iwamura |
| 2011/0211289 A1 | 9/2011 | Kosowsky et al. |
| 2011/0242921 A1 | 10/2011 | Tran et al. |
| 2011/0290174 A1 | 12/2011 | Leonard et al. |
| 2012/0018735 A1 | 1/2012 | Ishii |
| 2012/0086497 A1 | 4/2012 | Vorhaus |
| 2012/0126240 A1 | 5/2012 | Won |
| 2012/0199875 A1 | 8/2012 | Bhalla et al. |
| 2012/0211802 A1 | 8/2012 | Tamari |
| 2012/0218783 A1 | 8/2012 | Imada |
| 2012/0262220 A1 | 10/2012 | Springett |
| 2013/0277687 A1 | 10/2013 | Kobayashi et al. |
| 2013/0280877 A1 | 10/2013 | Kobayashi et al. |
| 2014/0117559 A1 | 5/2014 | Zimmerman et al. |

FOREIGN PATENT DOCUMENTS

| | | |
|---|---|---|
| JP | 10242584 A | 9/1998 |
| JP | 2000031535 A | 1/2000 |
| JP | 2003332618 A | 11/2003 |
| JP | 2008148511 A | 6/2008 |
| JP | 2008258419 A | 10/2008 |
| KR | 20070066051 A | 6/2007 |
| WO | 2004051707 A3 | 6/2004 |
| WO | 2011162243 A1 | 12/2011 |

OTHER PUBLICATIONS

Cho, H., et al., "High Density Plasma Via Hole Etching in SiC," Journal of Vacuum Science & Technology A: Surfaces, and Films, vol. 19, No. 4, Jul./Aug. 2001, pp. 1878-1881.

Darwish, A.M., et al., "Dependence of GaN HEMT Millimeter-Wave Performance on Temperature," IEEE Transactions on Microwave Theory and Techniques, vol. 57, No. 12, Dec. 2009, pp. 3205-3211.

Krüger, Olaf, et al., "Laser-Assisted Processing of VIAs for AlGaN/GaN HEMTs on SiC Substrates," IEEE Electron Device Letters, vol. 27, No. 6, Jun. 2006, pp. 425-427.

Sheppard, S.T., et al., "High Power Demonstration at 10 GHz with GaN/AlGaN HEMT Hybrid Amplifiers," 2000 Device Research Conference, Conference Digest, Jun. 2000, pp. 37-38.

Non-Final Office Action for U.S. Appl. No. 13/795,926, mailed Dec. 19, 2014, 14 pages.

Non-Final Office Action for U.S. Appl. No. 13/942,998, mailed Nov. 19, 2014, 9 pages.

Non-Final Office Action for U.S. Appl. No. 13/871,526, mailed Dec. 16, 2014, 17 pages.

Final Office Action for U.S. Appl. No. 13/910,202, mailed Jan. 20, 2015, 10 pages.

Notice of Allowance for U.S. Appl. No. 13/914,060, mailed Nov. 13, 2014, 8 pages.

Final Office Action for U.S. Appl. No. 13/966,400, mailed Dec. 3, 2014, 8 pages.

Final Office Action for U.S. Appl. No. 13/795,986, mailed Dec. 5, 2014, 16 pages.

Author Unknown, "CGHV1J006D: 6 W, 18.0 GHz, GaN HEMT Die," Cree, Inc., 2014, 9 pages.

International Search Report and Written Opinion for PCT/US2013/056105, mailed Feb. 12, 2014, 15 pages.

Non-Final Office Action for U.S. Appl. No. 13/910,202, mailed Sep. 25, 2014, 9 pages.

Final Office Action for U.S. Appl. No. 13/927,182, mailed Sep. 17, 2014, 10 pages.

Non-Final Office Action for U.S. Appl. No. 13/974,488, mailed Oct. 28, 2014, 8 pages.

Non-Final Office Action for U.S. Appl. No. 13/966,400, mailed Sep. 3, 2014, 9 pages.

Non-Final Office Action for U.S. Appl. No. 13/957,698, mailed Nov. 5, 2014, 11 pages.

Final Office Action for U.S. Appl. No. 13/973,482, mailed Nov. 5, 2014, 9 pages.

Chang, S.J. et al., "Improved ESD protection by combining InGaN—GaN MQW LEDs with GaN Schottky diodes," IEEE Electron Device Letters, Mar. 2003, vol. 24, No. 3, pp. 129-131.

Chao, C-H., et al., "Theoretical demonstration of enhancement of light extraction of flip-chip GaN light-emitting diodes with photonic crystals," Applied Physics Letters, vol. 89, 2006, 4 pages.

Fath, P. et al., "Mechanical wafer engineering for high efficiency solar cells: An investigation of the induced surface damage," Conference Record of the Twenty-Fourth IEEE Photovoltaic Specialists Conference, Dec. 5-9, 1994, vol. 2, pp. 1347-1350.

Han, D.S. et al., "Improvement of Light Extraction Efficiency of Flip-Chip Light-Emitting Diode by Texturing the Bottom Side Surface of Sapphire Substrate," IEEE Photonics Technology Letters, Jul. 1, 2006, vol. 18, No. 13, pp. 1406-1408.

Hibbard, D.L. et al., "Low Resistance High Reflectance Contacts to p—GaN Using Oxidized Ni/Au and Al or Ag," Applied Physics Letters, vol. 83 No. 2, Jul. 14, 2003, pp. 311-313.

Lee, S.J., "Study of photon extraction efficiency in InGaN light-emitting diodes depending on chip structures and chip-mount schemes," Optical Engineering, SPIE, Jan. 2006, vol. 45, No. 1, 14 pages.

Shchekin, O.B. et al., "High performance thin-film flip-chip InGaN—GaN light-emitting diodes," Applied Physics Letters, vol. 89, 071109, Aug. 2006, 4 pages.

Wierer, J. et al., "High-power AlGaInN flip-chip light-emitting diodes," Applied Physics Letters, vol. 78 No. 22, May 28, 2001, pp. 3379-3381.

Windisch, R. et al., "40% Efficient Thin-Film Surface-Textured Light-Emitting Diodes by Optimization of Natural Lithography," IEEE Transactions on Electron Devices, Jul. 2000, vol. 47, No. 7, pp. 1492-1498.

Windisch, R. et al., "Impact of texture-enhanced transmission on high-efficiency surface-textured light-emitting diodes," Applied Physics Letters, Oct. 8, 2001, vol. 79, No. 15, pp. 2315-2317.

Advisory Action for U.S. Appl. No. 10/620,205, mailed Feb. 15, 2005, 2 pages.

(56) References Cited

OTHER PUBLICATIONS

Final Office Action for U.S. Appl. No. 10/620,205, mailed Dec. 16, 2004, 9 pages.
Non-Final Office Action for U.S. Appl. No. 10/620,205, mailed Jul. 23, 2004, 7 pages.
Non-Final Office Action for U.S. Appl. No. 10/620,205, mailed May 3, 2005, 10 pages.
Notice of Allowance for U.S. Appl. No. 10/620,205, mailed Dec. 8, 2005, 4 pages.
Non-Final Office Action for U.S. Appl. No. 10/689,980, mailed Jan. 26, 2005, 7 pages.
Non-Final Office Action for U.S. Appl. No. 10/689,980, mailed May 12, 2005, 8 pages.
Non-Final Office Action for U.S. Appl. No. 12/841,225 mailed Dec. 22, 2011, 8 pages.
Non-Final Office Action for U.S. Appl. No. 11/397,279, mailed Oct. 31, 2007, 7 pages.
Notice of Allowance for U.S. Appl. No. 11/397,279, mailed Apr. 17, 2008, 7 pages.
Final Office Action for U.S. Appl. No. 10/689,979, mailed Jun. 29, 2005, 16 pages.
Non-Final Office Action for U.S. Appl. No. 10/689,979, mailed Jan. 11, 2005, 14 pages.
Notice of Allowance for U.S. Appl. No. 10/689,979, mailed Oct. 26, 2005, 6 pages.
Notice of Allowance for U.S. Appl. No. 12/841,225, mailed Nov. 9, 2012, 5 pages.
Non-Final Office Action for U.S. Appl. No. 11/360,734, mailed Jan. 18, 2008, 10 pages.
Notice of Allowance for U.S. Appl. No. 11/360,734, mailed Aug. 7, 2008, 6 pages.
Non-Final Office Action for U.S. Appl. No. 12/841,257 mailed Jan. 5, 2012, 13 pages.
Advisory Action for U.S. Appl. No. 11/937,207, mailed Feb. 2, 2010, 2 pages.
Final Office Action for U.S. Appl. No. 11/937,207, mailed Nov. 19, 2009, 9 pages.
Non-Final Office Action for U.S. Appl. No. 11/937,207, mailed Mar. 18, 2010, 10 pages.
Non-Final Office Action for U.S. Appl. No. 11/937,207, mailed May 29, 2009, 11 pages.
Notice of Allowance for U.S. Appl. No. 11/937,207, mailed Feb. 28, 2011, 8 pages.
Quayle Action for U.S. Appl. No. 11/937,207, mailed Nov. 24, 2010, 4 pages.
Final Office Action for U.S. Appl. No. 11/458,833, mailed Dec. 15, 2008, 13 pages.
Non-Final Office Action for U.S. Appl. No. 11/458,833, mailed Apr. 1, 2008, 10 pages.
Notice of Allowance for U.S. Appl. No. 11/458,833, mailed Mar. 9, 2009, 7 pages.
Invitation to Pay Fees for PCT/US2013/056105, mailed Nov. 5, 2013, 7 pages.
International Search Report and Written Opinion for PCT/US2013/056126, mailed Oct. 25, 2013, 10 pages.
International Search Report and Written Opinion for PCT/US2013/056132, mailed Oct. 10, 2013, 11 pages.
International Search Report and Written Opinion for PCT/US2013/056187, mailed Oct. 10, 2013, 11 pages.
International Search Report for GB0902558.6, issued Jun. 15, 2010, by the UK Intellectual Property Office, 2 pages.
Examination Report for British Patent Application No. 0902558.6, mailed Nov. 16, 2012, 5 pages.
Examination Report for British Patent Application No. GB0902558.6, issued Feb. 28, 2013, 2 pages.
Non-Final Office Action for U.S. Appl. No. 12/705,869, mailed Feb. 9, 2012, 10 pages.
Notice of Allowance for U.S. Appl. No. 12/705,869, mailed Apr. 4, 2013, 9 pages.
Notice of Allowance for U.S. Appl. No. 12/705,869, mailed Jul. 19, 2012, 8 pages.
Advisory Action for U.S. Appl. No. 12/841,225, mailed Apr. 16, 2012, 3 pages.
Final Office Action for U.S. Appl. No. 12/841,225 mailed Feb. 1, 2012, 9 pages.
Non-Final Office Action for U.S. Appl. No. 12/841,225, mailed May 2, 2012, 10 pages.
Notice of Allowance for U.S. Appl. No. 13/795,926, mailed Apr. 27, 2015, 8 pages.
Notice of Allowance for U.S. Appl. No. 13/942,998, mailed Apr. 27, 2015, 8 pages.
Final Office Action for U.S. Appl. No. 13/871,526, mailed Jun. 17, 2015, 11 pages.
Notice of Allowance for U.S. Appl. No. 13/910,202, mailed May 14, 2015, 9 pages.
Notice of Allowance for U.S. Appl. No. 13/974,488, mailed May 29, 2015, 9 pages.
Corrected/Supplemental Notice of Allowability for U.S. Appl. No. 13/957,689, mailed May 20, 2015, 3 pages.
Corrected/Supplement Notice of Allowability for U.S. Appl. No. 13/957,689, mailed Jun. 9, 2015, 4 pages.
Notice of Allowance for U.S. Appl. No. 13/973,482, mailed May 4, 2015, 7 pages.
International Preliminary Report on Patentability for PCT/US2013/056105, mailed Mar. 5, 2015, 12 pages.
International Preliminary Report on Patentability for PCT/US2013/056126, mailed Mar. 5, 2015, 7 pages.
International Preliminary Report on Patentability for PCT/US2013/056132, mailed Mar. 5, 2015, 9 pages.
International Preliminary Report on Patentability for PCT/US2013/056187, mailed Mar. 12, 2015, 9 pages.
Advisory Action for U.S. Appl. No. 13/910,202, mailed Apr. 6, 2015, 3 pages.
Final Office Action for U.S. Appl. No. 13/974,488, mailed Feb. 20, 2015, 8 pages.
Notice of Allowance for U.S. Appl. No. 13/966,400, mailed Feb. 20, 2015, 8 pages.
Notice of Allowance for U.S. Appl. No. 13/957,698, mailed Mar. 30, 2015, 7 pages.
Notice of Allowance for U.S. Appl. No. 13/795,986, mailed Mar. 6, 2015, 8 pages.
Non-Final Office Action for U.S. Appl. No. 13/927,182, mailed May 1, 2014, 7 pages.
Non-Final Office Action for U.S. Appl. No. 13/973,482, mailed May 23, 2014, 8 pages.
Non-Final Office Action for U.S. Appl. No. 13/795,986, mailed Apr. 24, 2014, 13 pages.
Advisory Action for U.S. Appl. No. 13/871,526, mailed Sep. 3, 2015, 3 pages.
Notice of Allowance for U.S. Appl. No. 13/957,698, mailed Jul. 20, 2015, 7 pages.
Non-Final Office Action for U.S. Appl. No. 14/557,940, mailed Aug. 31, 2015, 8 pages.
Corrected/Supplemental Notice of Allowability for U.S. Appl. No. 13/957,698, mailed Nov. 4, 2015, 4 pages.

* cited by examiner

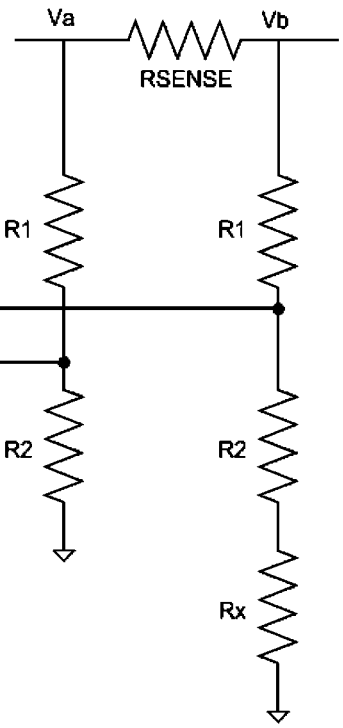

$$V_a\left(1+\frac{R_x}{R_1+R_2}\right)=V_b\left(1+\frac{R_x}{R_2}\right) \quad (1)$$

If Va=65 V, Vb = 60 for VDD/2 (common mode) at each node (Va and Vb), $$65\left(\frac{R_2}{R_1+R_2}\right)=2.5 \quad (2)$$

$$\frac{R_2}{R_1+R_2}=\frac{1}{26} \quad (3)$$

$$\therefore R_1 = 25R_2 \quad (4)$$

If $R_2$=10kΩ, $R_1$=250kΩ. From eq.(1), $$65\left(1+\frac{R_x}{260k}\right)=60\left(1+\frac{R_x}{10k}\right) \quad (5)$$

$$13+\frac{13R_x}{260k}=12+\frac{12R_x}{10k} \quad (6)$$

$$\therefore R_x = 869.6 \; \Omega \quad (7)$$

FIG. 14

POWER AMPLIFIER CONTROLLER

RELATED APPLICATIONS

This application claims the benefit of U.S. provisional patent application No. 61/720,149, filed Oct. 30, 2012, the disclosure of which is incorporated herein by reference in its entirety.

FIELD OF THE DISCLOSURE

The present disclosure relates to a power amplifier controller for preventing damage of a power amplifier during startup, operation, and shutdown.

BACKGROUND

In order to safely use a new technology power amplifier such as a gallium nitride (GaN) power amplifier, a user must provide an appropriate bias voltage for the power amplifier. Typically, this bias voltage must be adjusted to set a quiescent current for each power amplifier. Moreover, some means must be provided to selectively apply and remove a supply voltage for the power amplifier. Further still, the bias voltage and the supply voltage must be applied and removed using appropriate sequencing. Unless proper biasing and sequencing is provided for a power amplifier, the power amplifier will typically fail catastrophically. What is needed is a power amplifier controller that is adapted to generate predetermined bias levels that are appropriately output to a power amplifier during startup, operation, and shutdown sequences for the power amplifier.

SUMMARY

The present disclosure provides a power amplifier controller for starting up, operating, and shutting down a power amplifier. The power amplifier controller includes current sense amplifier circuitry adapted to monitor a main current of the power amplifier. A bias generator is also included and adapted to provide a predetermined standby bias voltage and an operational bias voltage based upon a main current level sensed by the current sense amplifier. The power amplifier controller further includes a sequencer adapted to control startup and shutdown sequences of the power amplifier.

In at least one embodiment, the power amplifier is a gallium nitride (GaN) device, and the main current level sensed is a drain current of the GaN device. Moreover, the bias generator is a gate bias generator provided that the power amplifier is a field effect transistor (FET) device. In a case wherein the power amplifier is a bipolar junction transistor (BJT) device, the bias generator is a base bias generator.

A benefit of the present power amplifier controller is the safe operation of new technology amplifiers such as GaN amplifiers during startup and shutdown. Another benefit is that one embodiment of the present power amplifier controller is manufacturable as an integrated circuit. Moreover, another embodiment provides the benefit of having the present power amplifier controller integrated into a module that includes a power amplifier. Additional benefits include, but are not limited to, a reduction of board space and a minimization of the number of voltage rails needed to operate the power amplifier.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

FIG. 14 is a diagram with calculations for adjusting the current sense circuitry for a particular power amplifier.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Figure 1:
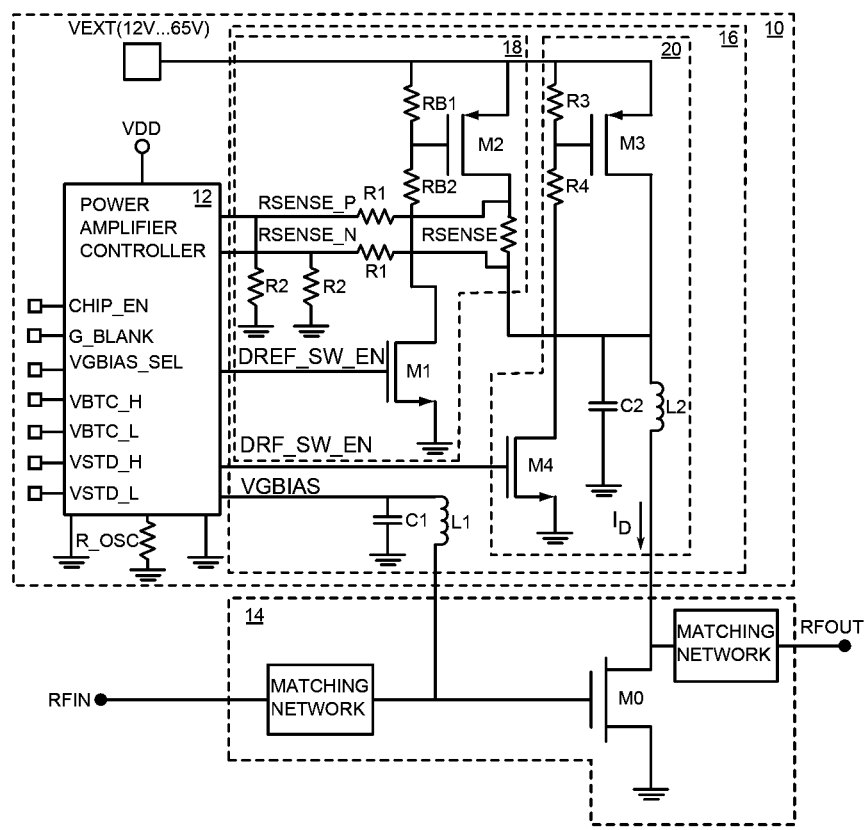
FIG. 1 is a schematic diagram of a power amplifier controller system that is in accordance with the present disclosure.

The present disclosure provides a power amplifier controller that is adapted to generate predetermined bias levels that are appropriately output to a power amplifier during startup, operation, and shutdown sequences for the power amplifier. FIG. 1 is a schematic diagram of a power amplifier controller system 10 that is in accordance with the present disclosure. The power amplifier controller system 10 includes a power amplifier controller 12 for starting up, operating, and shutting down a power amplifier 14. In at least one embodiment, the power amplifier controller 12 is an integrated circuit that interfaces with external circuitry 16. The external circuitry 16 conveys a bias voltage VGBIAS generated by the power amplifier controller 12 to the power amplifier 14. The bias voltage VGBIAS is filtered via a capacitor C1 and an inductor L1.

In the exemplary case shown in FIG. 1, the power amplifier controller 12 responds to several control signals. A chip enable signal CHIP_EN forces proper de-bias sequences for safe shutdown or to force re-biasing to compensate for aging and/or temperature changes in the power amplifier system 10 and the power amplifier 14. A gate blanking signal G_BLANK is asserted to pinch off gate voltage for saving power and for re-applying prior-set gate voltage without having to restart a search for a quiescent voltage. A gate bias selection signal VGBIAS_SEL allows for gate voltage generation (−8V) and safe drain voltage sequencing. This allows use in modes where setting quiescent current is not desired, such as biasing Doherty peaking amplifiers.

A gate voltage temperature control high bit signal VBTC_H sets a most significant bit for providing temperature compensation to the bias voltage VGBIAS. Another gate voltage temperature control high bit signal VBTC_L sets a least significant bit for providing temperature compensation to the bias voltage VGBIAS. A gate voltage step time high bit signal VSTD_H sets a most significant bit for providing a counter value for a step unit of gate voltage change. Another gate voltage step time low bit signal VSTD_L sets a least significant bit for providing the counter value for the step unit of gate voltage change.

In the exemplary case of FIG. 1, the bias voltage VGBIAS is applied to the gate of a gallium nitride (GaN) transistor M0. The bias voltage VGBIAS is used to turn the GaN transistor M0 off during a shutdown sequence as well as provide a predetermined drain current $I_D$ for an operation sequence. The external circuitry 16 also includes a current sense network 18 that is used to sense current levels for the drain current $I_D$. The current sense network 18 includes an NMOS transistor M1 that is used to turn on a PMOS transistor M2 that when turned on allows the drain current $I_D$ to flow through a sense resistor RSENSE before flowing through the GaN transistor M0. The external circuitry 16 further includes a switch network 20 for enabling and disabling the flow of main current to the power amplifier 14. In this exemplary case of FIG. 1, the main current is the drain current $I_D$ that flows through the GaN transistor M0. The switch network 20 includes a PMOS transistor M3 through which the drain current $I_D$ flows when turned on. An NMOS transistor M4 is configured to turn on the PMOS transistor M3 in order to bypass the current sense network 18 to eliminate an inefficiency of having the drain current $I_D$ flow through the sense resistor RSENSE. As will be explained in detail in later sections, the PMOS transistor M3 is used to pass the drain current $I_D$ during most power amplifier operation cycles. In contrast, the PMOS transistor M2 is used to pass the drain current $I_D$ when the drain current $I_D$ is being measured via the current sense network 18.

Figure 2:
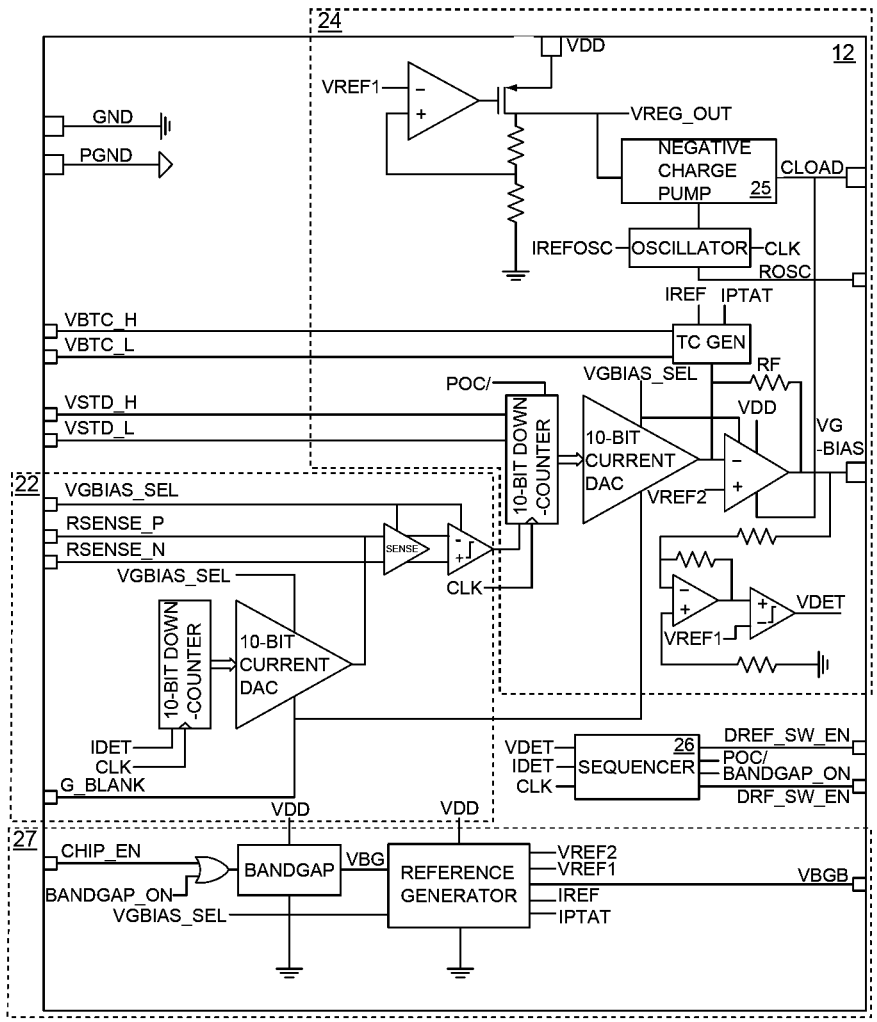
FIG. 2 is a schematic diagram of the power amplifier controller that generates bias voltages and controls startup and shut down sequencing of the power amplifier of FIG. 1.

FIG. 2 is a schematic diagram of the power amplifier controller 12 that generates bias voltages and controls startup and shutdown sequencing of the power amplifier 14 (FIG. 1). The power amplifier controller 12 includes current sense amplifier circuitry 22 that is adapted to monitor a main current of the power amplifier 14. The current sense amplifier circuitry 22 includes a first 10-BIT DOWN COUNTER that outputs a count to a first 10-BIT CURRENT DAC that outputs a precision current to a SENSE amplifier. The SENSE amplifier outputs a voltage signal RSENSE_P and a voltage signal RSENSE_N to a comparator that drives a second 10-BIT COUNTER that outputs a count value to a second 10-BIT CURRENT DAC that comprises a bias generator 24. The bias generator 24 is adapted to provide a predetermined standby bias voltage level and an operational bias voltage level based upon a main current level sensed by the current sense amplifier circuitry 22. The power amplifier controller further includes a sequencer 26 adapted to control startup and shutdown sequences of the power amplifier 14. A bandgap system 27 includes a bandgap voltage reference that when enabled by either the chip enable CHIP_EN signal or a BANDGAP_ON signal generates a bandgap voltage VBG. The bandgap system 27 also includes a reference generator that responds to the gate bias select signal VGBIAS_SEL to provide a first voltage reference VREF1, a second voltage reference VREF2, a generated bandgap voltage VBGB, a current reference IREF, and a current proportional to absolute temperature IPTAT. A temperature compensation generator TC GEN receives the IREF and the IPAT signals to generate a temperature compensation signal that combines with the current output from the second 10-BIT CURRENT DAC to drive an amplifier that outputs the VGBIAS voltage.

Referring to both FIG. 1 and FIG. 2, in an initial mode, an assertion of a chip enable signal CHIP_EN causes the power amplifier controller 12 to initiate the sequencer 26 to ensure that the gate of the GaN transistor M0 is driven to a pinch off voltage such as −6 V. A negative charge pump 25 (FIG. 2) comprising the bias generator 24 provides the pinch off voltage that is applied to the gate of the GaN transistor M0. In a startup sequence, the power amplifier controller 12 applies a reference switch enable signal DREF_SW_EN to the NMOS transistor M2, which in turn pulls on the gate of the PMOS transistor M1 to apply the supply voltage VEXT to the drain of the GaN transistor M0. At this point only leakage current will flow to the drain because the pitch off voltage is still applied at this instant. In order to raise the drain current $I_D$ to a predetermined quiescent point, the power amplifier controller 12 begins ramping the bias voltage VGBIAS in an operational voltage direction while the power amplifier controller 12 monitors the drain current $I_D$ via the current sense amplifier circuitry 22. At an instant when the drain current $I_D$ reaches a predetermined quiescent point, the power amplifier controller 12 halts the ramping of the bias voltage VGBIAS and holds the bias voltage VGBIAS constant. In order to improve power amplifier efficiency, the NMOS transistor M2 and the PMOS transistor M1 should be turned off so that the drain current $I_D$ no longer flows through the current sense resistor RSENSE. However, the supply voltage VEXT to the drain of the GaN transistor M0 must be maintained. Therefore, before the power amplifier controller 12 turns off the NMOS transistor M2 and the PMOS transistor M1, the power amplifier controller 12 applies an RF switch enable signal DRF_SW_EN to the NMOS transistor M4, which in turn pulls on the gate of the PMOS transistor M3, which turns on the PMOS transistor M3 to maintain application of the supply voltage VEXT to the drain of the GaN transistor M0. Once the supply voltage VEXT is held constant onto the drain of the GaN transistor M0, a radio frequency (RF) signal is applied to an RF input terminal RFIN.

Once the RF signal is removed from the RF input terminal RFIN and the chip enable signal CHIP_EN changes state, a shutdown sequence is commenced in which the power amplifier controller 12 ramps the bias voltage VGBIAS in a pinch off voltage direction until the bias voltage VGBIAS reaches a pinch off voltage. In the exemplary embodiment of FIG. 1, the pinch off voltage is a negative voltage, such as −6 V. Once the bias voltage VGBIAS reaches the pinch off voltage, the NMOS transistor M4 is turned off by inverting the RF switch enable signal DRF_SW_EN on the gate of the NMOS transistor M4, which in turn raises the gate of the PMOS transistor M3, which turns off the PMOS transistor M3 to remove the supply voltage VEXT from the drain of the GaN transistor M0.

In a restart mode, an assertion of a chip enable signal CHIP_EN causes the power amplifier controller 12 to start the sequencer 26 to ensure that the gate of the GaN transistor M0 is driven to a pinch off voltage. At this point only leakage current will flow to the drain because the pitch off voltage is still applied at this instant. In order to increase the drain current $I_D$ to the predetermined quiescent point, the power amplifier controller 12 ramps the bias voltage VGBIAS back to the voltage held during the initial mode. However, during the restart mode, the drain current $I_D$ does not flow through the current sense resistor RSENSE. Therefore, in this restart sequence, the NMOS transistor M2 and the PMOS transistor M1 remain off, and the reference switch enable signal DREF_SW_EN to the NMOS transistor M2 is not asserted. Instead, the power amplifier controller 12 applies the RF switch enable signal DRF_SW_EN to the NMOS transistor M4, which in turn pulls on the gate of the PMOS transistor M3, which turns on the PMOS transistor M3 to apply the supply voltage VEXT to the drain of the GaN transistor M0. Now that the supply voltage VEXT is held constant onto the drain of the GaN transistor M0, a radio frequency (RF) signal is applied to the RF input terminal RFIN. It is to be understood that the shutdown mode and the restart mode can alternately be continued indefinitely.

Figure 3:
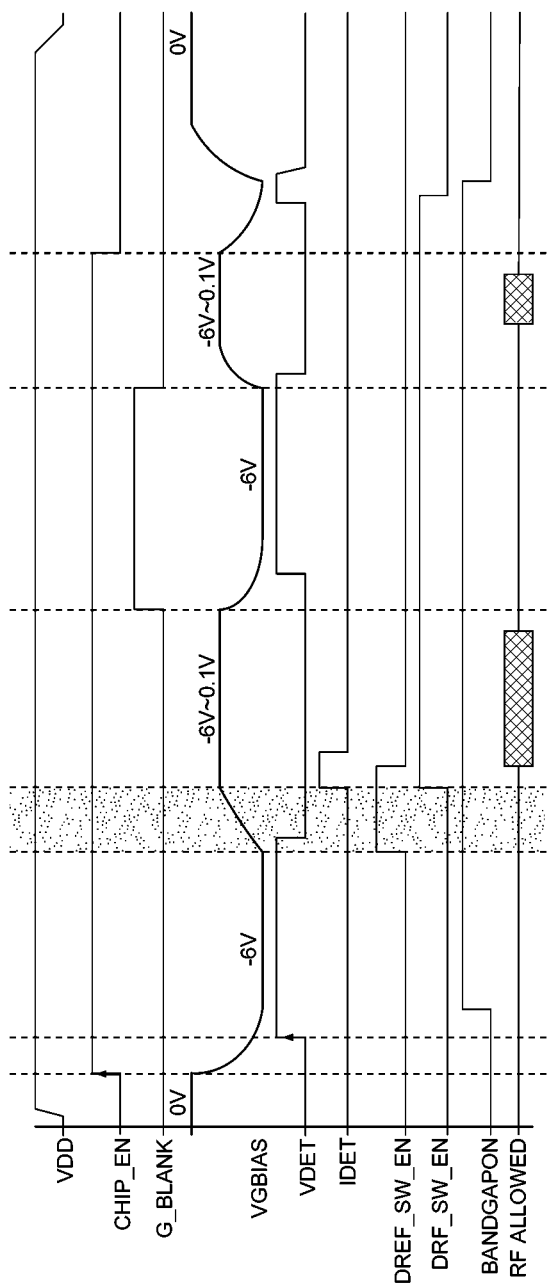
FIG. 3 is a timing diagram for the power amplifier controller of FIG. 1 and FIG. 2, wherein the voltage gain select signal is not asserted and the gate blanking signal is asserted within the enable signal.
Figure 4:
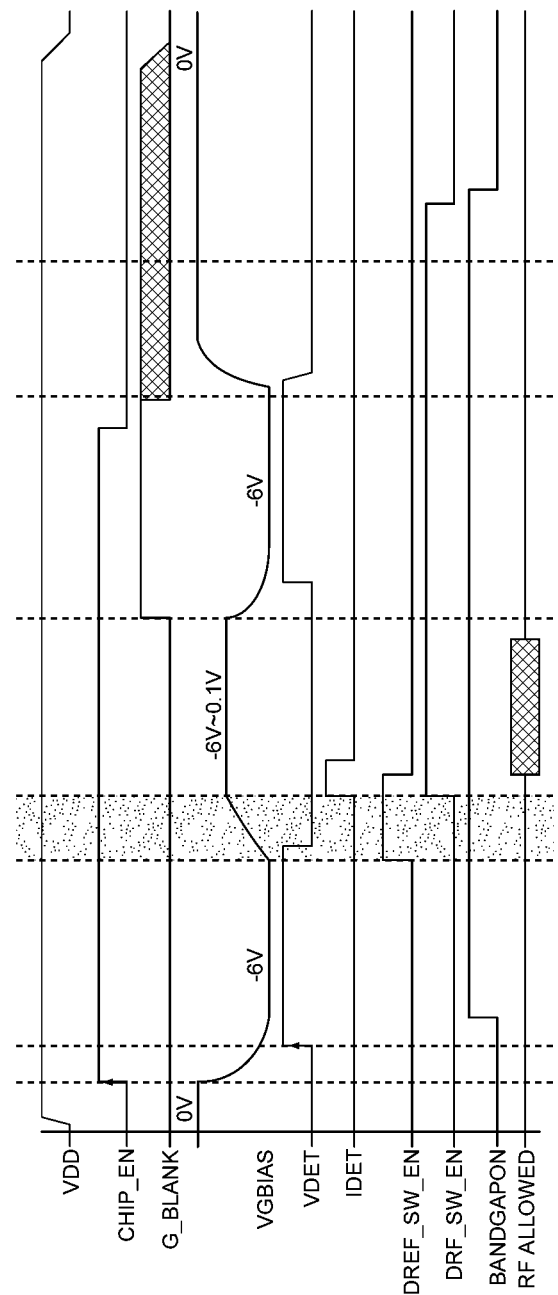
FIG. 4 is a timing diagram for the power amplifier, wherein the voltage gain select signal is not asserted while the enable signal is dropping and the gate blanking signal is asserted.
Figure 5:
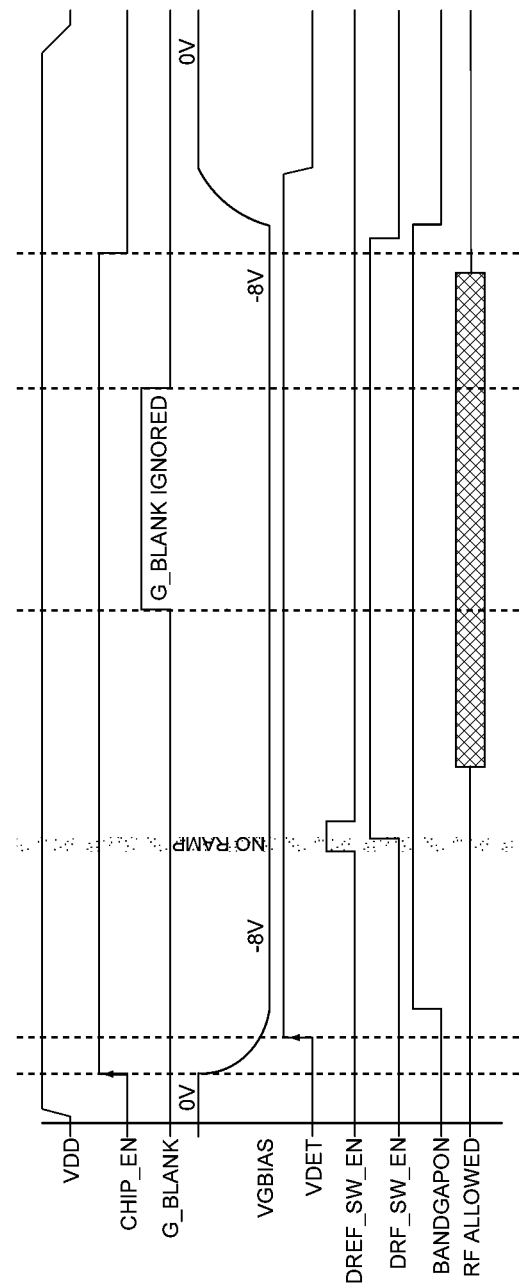
FIG. 5 is a timing diagram for the power amplifier controller, wherein the voltage gain select signal is asserted and the gate blanking signal is ignored.

FIG. 3 is a timing diagram for the power amplifier controller 12 of FIGS. 1 and 2, wherein the voltage gain select signal VGAIN_SEL=0 and the gate blanking signal G_BLANK is asserted within the chip enable signal CHIP_EN. FIG. 4 is a timing diagram for the power amplifier controller 12, wherein the voltage gain select signal VGAIN_SEL=0 with the chip enable signal CHIP_EN dropping while the gate blanking signal G_BLANK is asserted. FIG. 5 is a timing diagram for the power amplifier controller 12, wherein the voltage gain select signal VGAIN_SEL=1 and the gate blanking signal G_BLANK is ignored.

While referring to FIG. 3, FIG. 4, and FIG. 5, it can be seen that after a chip supply voltage VDD turns on and when the chip enable signal CHIP_EN goes high, internal CHIP_EN, the bandgap, and the negative charge pump turn on. The output VGBIAS goes to −6V. Once VGBIAS goes to −6V, an internal detector (VDET) detects −6V and turns on the reference switch enable signal DREF_SW_EN. The reference switch enable signal DREF_SW_EN will turn on the GaN drain switch M1. Power will be applied to the drain of the GaN transistor M0. The reference switch enable signal DREF_SW_EN also enables the 10-bit current DAC. Once the drain switch M1 turns on, the drain current $I_D$ starts to flow. The sense resistor RSENSE (FIG. 1) senses this current and creates a voltage drop between RSENSE_P and RSENSE_N. The 10 bit current DAC which drives the VGBIAS regulator keeps clocking in 4.88 mV steps until the voltages on RSENSE_P and RSENSE_N become equal and the DAC stops adjusting. The effective gate voltage at this time is stored in the 10-bit counter for later use.

Figure 6:
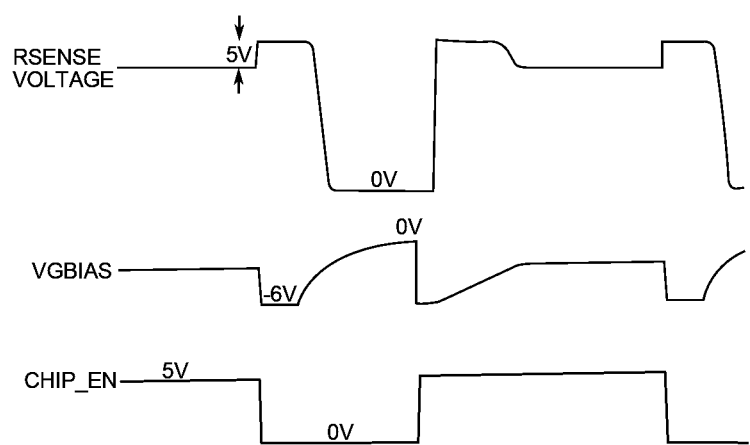
FIG. 6 is a diagram of waveforms generated by the power amplifier controller for a gallium nitride (GaN) based power amplifier operated at 48 V.

FIG. 6 is a diagram of waveforms generated by the power amplifier controller for a gallium nitride (GaN) based power amplifier operated at 48 V. The startup sequence starts just before the middle of the diagram where the chip enable signal CHIP_EN begins to rise.

Figure 7:
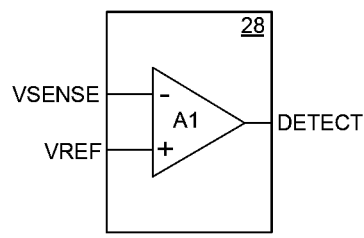
FIG. 7 is a schematic diagram of a prior art comparator.

In another embodiment of the present disclosure, the intent of a prior art comparator 28 is to provide a logic level signal out that indicates which of the comparator's inputs has the higher voltage (FIG. 7). This relationship can be expressed mathematically as: DETECT=VREF>VSENSE. Unfortunately, the prior art comparator actually implements the comparison as DETECT=VREF−VSENSE>VOFFSET, where VOFFSET is the offset voltage inherent in the differential inputs of the comparator. The disclosed device uses the amplifier of an active sample-hold circuit 30 as a comparator.

When "Sample" is asserted, switch "S1" is closed. Given that there is negligible voltage drop across Switch "S1" in this condition, then VOUT=(VSENSE+VOFFSET)*GA/(1+GA), where GA is the gain of amplifier "A1". The voltage across capacitor "CS1" will approach this same voltage as the circuit settles. If VSENSE=VREF when "Sample" is asserted, then the voltage across capacitor "CS1" will settle to (VREF+VOFFSET)*GA/(1+GA). If "Sample" is then de-asserted, VOUT=(VSENSE+VOFFSET+(VSENSE−VREF) *GA)* (GA/(1+GA))

To the extent that GA>>1, this equation simplifies to: VOUT=VSENSE+VOFFSET+(VSENSE−VREF)*GA.

From this simplified equation, some observations may be made that hold in general. The contribution of VOFFSET to VOUT is not multiplied by GA as it would be in a traditional differential amplifier/comparator. When VSENSE=VREF, VOUT=(VREF+VOFFSET)*(GA/(1+GA)). From the first observation, it is clear that the sensitivity to DC offset of the amplifier/comparator has been extremely reduced.

Figure 8:
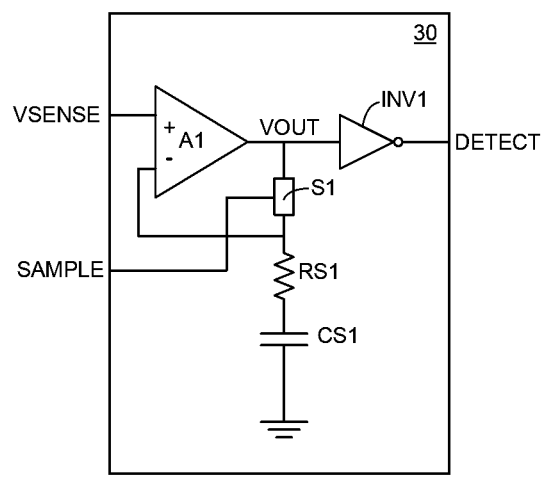
FIG. 8 is a schematic diagram of an active sample and hold circuit.

From the second observation, it can be seen that strategic selection of VREF will allow the amplifier to directly drive a logic gate or inverter INV1 as shown in FIG. 8. Specifically, VREF should be chosen to be close to a logic threshold voltage (VLT) of the logic family being used. In the case of CMOS logic, VREF should be near 50% of the VDD used to supply the logic. The behavior of this configuration is represented by:

$$\text{DETECT}=(V\text{OFFSET}+V\text{SENSE}*(1+GA)-V\text{REF}*GA)*(GA/(1+GA))<VLT.$$

This equation progressively simplifies to:

$$\text{DETECT}=(V\text{SENSE}+(V\text{SENSE}-V\text{REF})*GA)*(GA/(1+GA))<VLT-V\text{OFFSET}*(GA/(1+GA)).$$

$$\text{DETECT}=V\text{SENSE}+(V\text{SENSE}-V\text{REF})*GA<VLT*(1+GA)/GA-V\text{OFFSET}$$

$$\text{DETECT}=(V\text{SENSE}-V\text{REF})*(1+GA)<VLT*(1+GA)/GA-V\text{REF}-V\text{OFFSET}$$

$$\text{DETECT}=(V\text{SENSE}-V\text{REF})<(VLT*(1+GA)/GA-V\text{REF}-V\text{OFFSET})/(1+GA)$$

$$\text{DETECT}=V\text{REF}-V\text{SENSE}>(VLT/GA+VLT-V\text{REF}-V\text{OFFSET})/(1+GA)$$

$$\text{DETECT}=V\text{REF}-V\text{SENSE}>((VLT-V\text{REF})+(VLT/GA-V\text{OFFSET}))/(1+GA)$$

$$\text{DETECT}=V\text{REF}-V\text{SENSE}>VOE/(1+GA). \text{ Where } VOE=(VLT-V\text{REF})+(VLT/GA-V\text{OFFSET})$$

It can be seen from this last equation that the equation has the same form as the equation describing operation of a traditional comparator. The effect of differences between VREF and VLT has been reduced by a factor greater than the gain of the amplifier stage.

Figure 9:
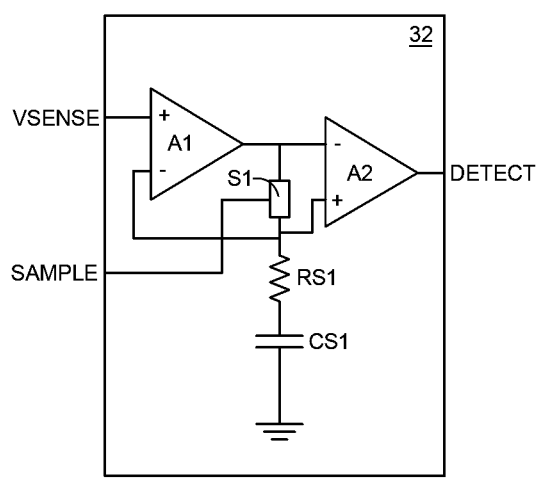
FIG. 9 is a schematic diagram of a generic self-zeroing comparator.

If VREF cannot be so chosen to be close to VLT, a comparator can be used to accomplish logic level translation. This configuration is shown in FIG. 9. The operation of this configuration is described by:

$$\text{DETECT}=(V\text{REF}+V\text{OFFSET})*GA/(1+GA)>(V\text{REF}+V\text{OFFSET}+(V\text{SENSE}-V\text{REF})*GA)*GA/(1+GA)+V\text{OFFSET2}.$$

Where, VOFFSET2 is the offset voltage of the comparator used for logic level translation.

This last equation progressively simplifies to:

DETECT=$V$REF+$V$OFFSET>$V$REF+$V$OFFSET+
($V$SENSE−$V$REF)*$GA$+$V$OFFSET2*(1+$GA$)/$GA$

DETECT=0>($V$SENSE−$V$REF)*$GA$+$V$OFFSET2*(1+$GA$)/$GA$

DETECT=($V$REF−$V$SENSE)*$GA$>$V$OFFSET2*(1+$GA$)/$GA$

DETECT=$V$REF−$V$SENSE>$V$OFFSET2*(1+$GA$)/($GA$)2

It can be seen from this last equation that the equation has the same form as the equation describing operation of a traditional comparator. Offset in the amplifier stage has been completely removed from consideration. The effect of offset in the comparator stage has been reduced by a factor almost equal to the gain of the amplifier stage.

Either circuit can exhibit errors in its estimate of the DC reference voltage. These are exactly the same errors inherent with the use of any sample/hold amplifier: sample timing, settling, droop, and capacitor memory.

If Sample is not asserted at the correct time when the desired reference voltage is present, the voltage stored will not accurately represent the desired DC offset. If Sample is not asserted long enough, the voltage on the hold capacitor will not settle to the correct value. When Sample is not asserted, the voltage being held on the hold capacitor can droop due to leakage current in the circuit. Some capacitors tend to return toward a previously held voltage after being charged or discharged from that state.

In practice, these errors can all be minimized by proper circuit design and proper operation of the circuit.

Circuit Operation:
Assert "Sample" when VSENSE is at the desired reference voltage (VREF).
Let the sample voltage settle on the hold capacitor.
De-assert "Sample".
"DETECT" will then indicate that VSENSE has fallen below VREF−VOFF.

In the configuration of FIG. 8, VOFF=VOE/(1+GA), which is approximately equal to a fraction of the difference between the logic threshold voltage (VLT) and the reference voltage (VREF). The fraction is just slightly smaller than the reciprocal of the amplifier gain. For optimum performance, VREF should be nearly equal to VLT and GA should be high.

FIG. 9 is a schematic diagram of a generic self-zeroing comparator 32. In the configuration of FIG. 9, VOFF=VOFFSET2*(1+GA)/(GA)2, which is a small value equal to a fraction of the offset voltage of the comparator stage. The fraction is just slightly greater than the reciprocal of the amplifier gain. For optimum performance, VOFFSET2 should not be huge and GA should be high.

Figure 10:
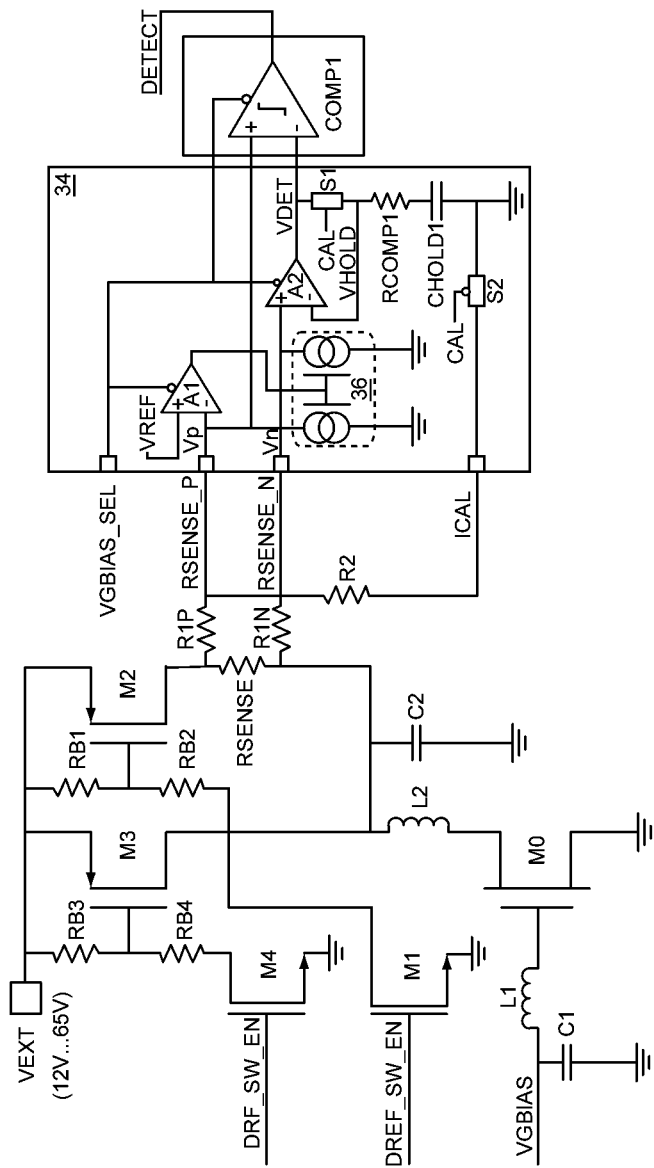
FIG. 10 is a schematic diagram of an auto-zeroing sense amplifier.

FIG. 10 is a schematic diagram of an auto-zeroing sense amplifier 34. With reference to another embodiment of the present disclosure, the controlled current sources 36 sets up biasing for the amplifier A2 such that:

The voltage on RSENSE_P is equal to VREF+VOFF1, where VOFF1 is the offset voltage of A1.
The voltage between RSENSE_P and RSENSE_N is equal to the voltage across RSENSE when R2 is disconnected.
A known DC offset can be intentionally introduced by connecting the resistor R2 between RSENSE_P and ground. To the extent that the voltage on RSENSE_P is constant (≈VREF), the presence of R2 has no effect on the differential gain or common mode rejection of the amplifier.

To the extent that the current sources 36 are very high impedance:
There is unity differential gain from across RSENSE to between RSENSE_P and RSENSE_N.
There is good common mode rejection.
Mismatches between the two R1 resistors create only DC offset errors not gain errors.
Mismatches between the two controlled current sources 36 also create only DC offset errors.

DC offset from component value variation can be removed by sampling the voltage on RSENSE_N when there is no current flowing through either RSENSE or R2 and then subtracting this sampled voltage from the voltage on RSENSE_N during normal operation. If the amplifier (A2) is used in an active sample-hold circuit to also take the difference between RSENSE_N and the held value, the DC offset in that amplifier is also cancelled out. The voltage on VDET is then VEXT*$(1-\alpha)+\alpha$*Vp+($\alpha$*Vth−Id*sense)*(1+A2). Where $\alpha$ is the imbalance between the negative and positive sides of the amplifier. Specifically, $\alpha$=(Icn/Icp)*(R1$n$+RSENSE)/R1$p$. If $\alpha$=1, i.e. the two sides are perfectly balanced, then VDET=Vp+(Vth−Id*sense)*(1+A2).

The effect of any DC offset in a comparator COMP1 is then suppressed by the gain of A2. In fact, if Vp is set to ½ of the supply voltage used for the CMOS logic that follows this sense circuit and the gain of A2 is large enough, a simple inverter can be used in place of the comparator Cp.

The bandgap voltage can be trimmed such that the voltage Vp on the RSENSE_P terminal has its desired value. Trimming in this manner also removes the effect of VOFF1. If the bandgap is a trimmed bandgap to give 1% accuracy in the voltage on RSENSE_P, RSENSE has a relative accuracy of 1% and the ratio of R1 to R2 is accurate to 1%, then 3% accuracy can be achieved for the entire sense circuit.

For users, the value of R2 could be adjusted to provide the desired current detection threshold. This calibration can be done to the accuracy the customer desires and is limited only by DC drift in the circuit over temperature and age.

The controlled current sources only need to provide constant current over a limited voltage range. The voltage on the RSENSE_P terminal is set to Vp=VREF+VOFF1. It is expected that Vp will be calibrated to be 2.5V±1%, i.e. 2.5V±25 mV. Good design practices would suggest that this current source should be well behaved over a voltage range of 2.4 to 2.6 V. This provides enough compliance to allow the circuit to work properly without or prior to precision trimming.

During operational calibration, R2 is disconnected and the voltage on the RSENSE_N terminal will be set to Vn=VEXT*$(1-\alpha)+\alpha$*Vp. If the R1 resistors are matched to within 0.5% and the current sources are matched to within 1%, then $\alpha$=1±1.5% and for VEXT=65V±5%, Vp=2.5V±1%, Vn=2.5V±1.0V. The current in the current source should not be allowed to vary by more than 0.1% over this voltage range.

Just after operational calibration, the Vn voltage established during calibration is held on the hold capacitor and R2 is reconnected. The GaN gate bias will still be highly negative and only leakage current will be drawn through RSENSE by the GaN device. This same leakage current was present during calibration, so Vn will attempt to go to Vp+Vth. Since Vth may be on the order of ½ volt to a few volts, Vp+Vth may be well above the compliant range of the current source at this time. This is proper. The behavior of the current source only needs to be accurate when Vn is near the voltage held during calibration. The RSENSE_N terminal should be diode clamped to VDD, however, to prevent damage to the device from occurring just after operational calibration.

After the condition just described, the GaN gate voltage will start ramping up, $I_D$ will increase, and Vn will ramp down toward Vp. When the desired value drain current is reached, Vn will have the same value as it did during operational calibration. The compliance needed to facilitate accurate detection of the desired drain current is then the same as the compliance needed during calibration.

As can be seen from the above discussion, the required compliance range is determined by the highest possible value of VEXT, the accuracy of Vp, the matching of the two R1s, and the matching of the two controlled current sources.

Since VEXT>α*Vp, (VEXT=12 to 65 V and α*Vp<3 V), the required range is given by:

$$V\text{max}=\text{max}(V\text{EXT})*(1-\text{min}(\alpha))+\text{max}(Vp)*\text{min}(\alpha)$$

$$V\text{min}=\text{max}(V\text{EXT})*(1-\text{max}(\alpha))+\text{min}(Vp)*\text{max}(\alpha)$$

$$\alpha=(Icn/Icp)*(R1n+RSENSE)/R1p.$$

Note also that headroom can be traded for legroom and vice versa simply by adjusting Vp.

The required compliance range (Vmax−Vmin) can then be reduced by:
  Improving the trimming of Vp.
  Improving the matching of R1p to R1n+RSENSE.
  Improving the matching of the two current sources.
  Trimming one of the current sources to make a very nearly equal to unity.

The current source may be trimmed during the operational calibration interval. If one assumes resistor matching of 0.5% and current source matching of 1%, then one of the current sources could be designed to be nominally 1.5% larger than the other. At least 3% of this current source could then be segmented into 15 parts to allow a to be trimmed to an accuracy of ±0.1%. This would give:

$$V\text{max}=2.525V*0.999+69V*0.001=2.591V$$

$$V\text{min}=2.475V*1.001-69V*0.001=2.408V$$

Figure 11:
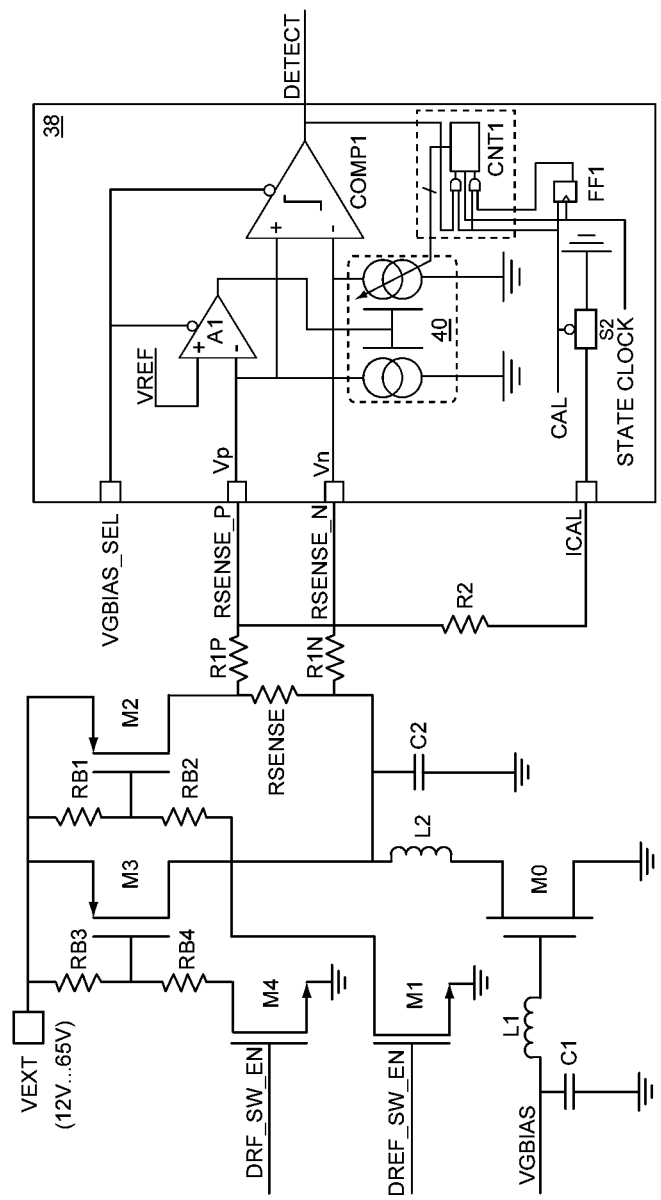
FIG. 11 is a schematic diagram of an auto-zeroing sense amplifier with current trimming.

Trimming a current source is a means of reducing the needed compliance range (FIG. 11). Trimming, however, effectively adjusts the differential DC offset between Vn and Vp. The trimming just described could then also be used for auto-zeroing. If the sample and hold were eliminated, a comparator with a DC offset less than 100 mV was used between Vn and Vp and the compliance of the RSENSE_N terminal spanned the range from 2.3V to 2.7V, then 11 segments of 1% each on the current source could achieve a detection accuracy of ±0.5% in the sense amplifier. If a 1% resistor was used for RSENSE, Vp was trimmed to 1%, and R1 was matched to R2 to within 1%, an overall detection accuracy of ±3.5% could be achieved.

A counter CNT1 used to control the current source may be configured to initially set Vn higher than Vp and bring Vn down to approach Vp during calibration. This makes the comparator approach its detection threshold from the same direction during calibration as it does in operation.

Common mode rejection in the original sense amplifier may be limited to 36 dB by the matching accuracy of the current sources and R1 resistors. However, the sample-hold amplifier had unity common mode gain and a differential gain of at least 40 dB. This may give performance equivalent to 76 dB of common mode rejection when normalized to unity differential gain. In short, common mode rejection was a non-issue in the original circuit.

With the sample-hold amplifier removed and current source trimming added as described above, the sense amplifier has unity differential gain and can achieve 60 dB of common mode rejection. This would appear to be adequate. Unfortunately, the auto-zeroing mechanism unbalances the sense amplifier in order to compensate for DC offset in the comparator. With a DC offset of 100 mV and a supply voltage VEXT=65V, the common mode rejection is limited to 56 dB. If a supply voltage VEXT=12V, the common mode rejection is limited to 40 dB. This may be acceptable. The effects of unit-to-unit variation and long term drift of VEXT are removed by the auto-zeroing. Noise on VEXT or droop on VEXT when the GaN drain current is ramped can, however, cause a detection error if there is inadequate common mode rejection in the sense amplifier. A 10% droop with 40 dB of common mode rejection would introduce a 0.1% detection error. This should be acceptable.

If the DC offset allowed in the comparator were reduced to 25 mV, however, 52 dB of common mode rejection could be achieved with VEXT=12V and 59 dB when VEXT=65V. This tightening of the requirement for offset in the comparator from 100 mV to 25 mV would also relax the compliance range of the current source by 150 mV. DC offset should, therefore, be made as low as is practical when this auto-zeroing technique is used.

Figure 12:
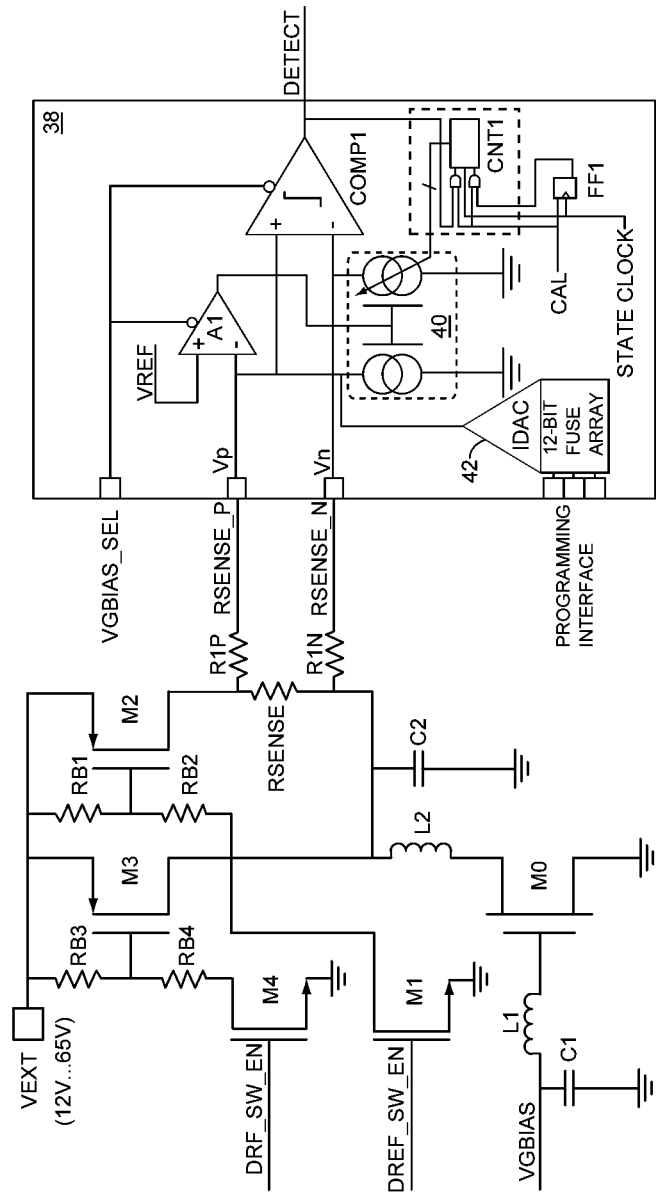
FIG. 12 is a schematic diagram of an auto-zeroing sense amplifier having a current digital to analog converter (DAC).

FIG. 12 is a schematic diagram of an auto-zeroing sense amplifier having a current digital to analog converter (DAC) 42 in place of R2. Let the current DAC 42 be programmable for currents of 0 and 0.9*N to N μA in 1% steps. Let N be trimmed to any desired value between 10 μA and 100 μA with a 4% accuracy. Composite trimming accuracy of the current DAC 42 is then 0.2% If a 1% resistor was used for RSENSE, a was trimmed as described for the alternate approach for auto-zeroing, and a 0.5% resistor was used for R1n, an overall detection accuracy of ±2.2% could be achieved with one less external component. The best possible outcome for matching of controlled current sources may be 1%.

If one segment of each of the two current sources 40 is then subdivided into ten sections that could be independently enabled or disabled, calibrated matching may be within 0.1%. This structure may be able to give any desired side-to-side current ratio between roughly 98% and 102% in steps of 0.2%. If desired, this structure could also be folded to minimize dimensional variation across its surface.

If the alternate technique for threshold setting is used, factory calibration requirement for Vp could be relaxed to ±4%. Vp only needs to be accurate enough to keep compliance requirements reasonable. The current DAC 42 may also be trimmed to a preset value ±0.2%. Alternatively, users may trim the current DAC 42 in a manner equivalent to the trimming of R2 in the original design. This method of factory calibration could achieve an overall detection accuracy of ±0.7% even using a 1% resistor for RSENSE and matching the R1 resistors to only 0.5%. The matching requirements for R1 might be further relaxed if the range for a trimming was increased and compliance requirements were still acceptable. This method of factory calibration may also remove any detection error from supply voltage VEXT droop to the extent that the droop was repeatable.

To support factory calibration, some sequential logic FF1 may be added to the detection threshold setting circuit. Users could then set the threshold higher than they expected should be needed and initiate a GaN startup sequence while monitoring GaN drain current. Once the desired drain current was reached, the startup sequence could be halted and the threshold setting ramped down until the comparator indicated detection. This threshold setting could then be programmed into the fuse array.

Figure 13:
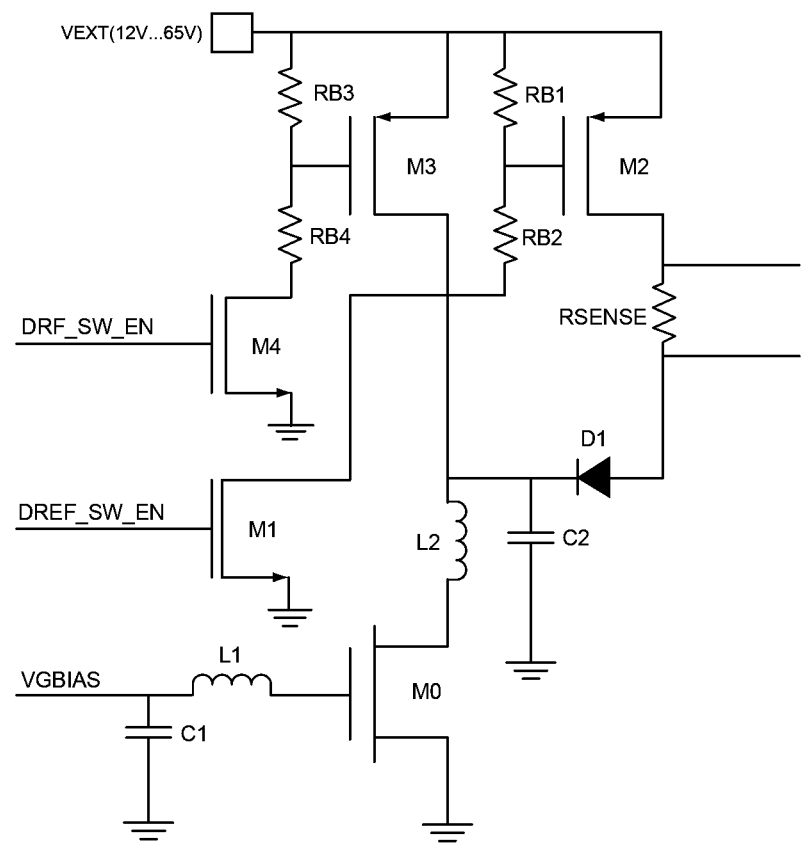
FIG. 13 is a schematic diagram of a power saving configuration for the current sense circuitry.

FIG. 13 is a schematic diagram of a power saving configuration for the current sense amplifier circuitry. A diode D1 can be placed in series between RSENSE and the point that provides the DC supply to the drain of the GaN device (FIG. 13). After the desired gate bias voltage has been determined by the sequencer 26 and the NMOS transistor M2 has been turned on for full operation of the GaN device, the PMOS transistor M1 can then be turned off so that the R1 resistors will no longer draw current from the supply voltage VEXT. This may reduce current draw from the supply voltage VEXT by about 2 mA, which amounts to a power savings of 130 mW if the supply voltage VEXT=65V. The sense amp and comparator can also be turned off to save a few more milliamps from being drawn from VDD.

FIG. 14 is a diagram with calculations for adjusting the current sense circuitry for a particular power amplifier. As shown in FIG. 14, two R1 resistors and two R2 resistors are used for symmetry and matching. A resistor RX is set to an offset value of resistance. However, it is to be understood that the resistor R2 in series with the resistor RX can be combined into one resistor to reduce the number of external resistors in order to save board space.

Those skilled in the art will recognize improvements and modifications to the embodiments of the present disclosure. All such improvements and modifications are considered within the scope of the concepts disclosed herein and the claims that follow.

What is claimed is:

1. A power amplifier controller comprising:
   current sense amplifier circuitry adapted to monitor a main current of a power amplifier;
   a bias generator adapted to provide a predetermined standby bias voltage and operational bias voltage for the power amplifier based upon a main current level sensed by the current sense amplifier circuitry;
   a sequencer adapted to control startup and shutdown sequences of the power amplifier; and
   temperature compensation circuitry adapted to compensate a gate bias generator for ambient temperature fluctuations.

2. The power amplifier controller of claim 1 further including bypass circuitry to reroute the main current of the power amplifier around the current sense amplifier circuitry to eliminate efficiency losses due to the main current passing through the current sense amplifier circuitry.

3. The power amplifier controller of claim 1 wherein the power amplifier comprises enhancement mode field effect transistor (FET) devices.

4. The power amplifier controller of claim 1 wherein the power amplifier comprises depletion mode FET devices.

5. The power amplifier controller of claim 1 wherein the power amplifier comprises a combination of enhancement mode FET devices and depletion mode FET devices.

6. The power amplifier controller of claim 1 wherein the power amplifier comprises bipolar junction transistor (BJT) devices.

7. The power amplifier controller of claim 1 wherein the power amplifier comprises a combination of BJT devices and FET devices.

8. The power amplifier controller of claim 1 wherein the power amplifier comprises gallium nitride (GaN) devices.

9. The power amplifier controller of claim 1 further including direct current (DC) offset circuitry to automatically adjust a detection threshold for the current sense amplifier circuitry.

10. A method of controlling a power amplifier comprising:
    driving a bias voltage of the power amplifier to a pinch off voltage;
    applying a supply voltage to the power amplifier;
    ramping the bias voltage in the direction of an operational voltage of the power amplifier;
    monitoring a main current flowing to the power amplifier;
    stopping the ramping of the bias voltage when the main current reaches a predetermined quiescent point; and
    compensating the bias voltage for ambient temperature fluctuations.

11. The method of controlling the power amplifier of claim 10 further comprising applying a signal to be amplified by the power amplifier to the power amplifier.

12. The method of controlling the power amplifier of claim 10 further comprising:
    dropping the bias voltage to the pinch off voltage; and
    removing the supply voltage from the power amplifier.

13. The method of controlling the power amplifier of claim 12 further including removing a signal to be amplified by the power amplifier from the amplifier prior to dropping the bias voltage to the pinch off voltage.

14. The method of controlling the power amplifier of claim 10 further including rerouting the main current to the power amplifier around current sense amplifier circuitry to eliminate efficiency losses due to the main current passing through the current sense amplifier circuitry.

15. The method of controlling the power amplifier of claim 10 further including automatically adjusting a detection threshold for current sense amplifier circuitry that monitors a main current flowing to the power amplifier.

16. The method of controlling the power amplifier of claim 10 wherein the power amplifier comprises GaN devices.

17. The method of controlling the power amplifier of claim 10 wherein the power amplifier comprises enhancement mode FET devices.

18. The method of controlling the power amplifier of claim 10 wherein the power amplifier comprises depletion mode FET devices.

19. The method of controlling the power amplifier of claim 10 wherein the power amplifier comprises a combination of enhancement mode FET devices and depletion mode FET devices.

20. The method of controlling the power amplifier of claim 10 wherein the power amplifier comprises BJT devices.

21. The method of controlling the power amplifier of claim 10 wherein the power amplifier comprises a combination of FET devices and BJT devices.

* * * * *

UNITED STATES PATENT AND TRADEMARK OFFICE
CERTIFICATE OF CORRECTION

PATENT NO.       : 9,325,281 B2
APPLICATION NO.  : 14/067019
DATED            : April 26, 2016
INVENTOR(S)      : Chris Levesque et al.

Page 1 of 1

It is certified that error appears in the above-identified patent and that said Letters Patent is hereby corrected as shown below:

In the Specification:

In column 9, line 31, replace "to make a very nearly" with --to make α very nearly--.

In column 10, line 35, replace "a was trimmed" with --α was trimmed--.

In column 10, line 57, replace "range for a trimming" with --range for α trimming--.

Signed and Sealed this
Twenty-eighth Day of June, 2016

Michelle K. Lee
*Director of the United States Patent and Trademark Office*